(12) United States Patent
Kalnitsky et al.

(10) Patent No.: US 6,188,056 B1
(45) Date of Patent: Feb. 13, 2001

(54) SOLID STATE OPTICAL IMAGING PIXEL WITH RESISTIVE LOAD

(75) Inventors: Alexander Kalnitsky, San Francisco, CA (US); Frank Randolph Bryant, Denton, TX (US); Marco Sabatini, Berkeley, CA (US)

(73) Assignee: STMicroelectronics, Inc., Carrollton, TX (US)

( * ) Notice: Under 35 U.S.C. 154(b), the term of this patent shall be extended for 0 days.

(21) Appl. No.: 09/103,753

(22) Filed: Jun. 24, 1998

(51) Int. Cl.[7] .................................................... H01L 27/00

(52) U.S. Cl. ...................... 250/208.1; 250/214.1

(58) Field of Search ................. 250/208.1, 214 A, 250/214 LA, 214 LS, 214.1, 214 SG, 214 RC; 257/293

(56) References Cited

U.S. PATENT DOCUMENTS

| | | | |
|---|---|---|---|
| 3,210,548 | * | 10/1965 | Morrison .................... 250/214 PR |
| 4,461,956 | * | 7/1984 | Hatanaka et al. ............... 250/578 |
| 4,803,375 | * | 2/1989 | Saito et al. .................... 250/578 |

* cited by examiner

*Primary Examiner*—Que T. Le
(74) *Attorney, Agent, or Firm*—Theodore E. Galanthay; Lisa K. Jorgenson; Jeffrey K. Weaver

(57) ABSTRACT

Disclosed is a CMOS image sensor that includes pixels employing a radiation-sensitive resistive element in which the resistance of the element changes in response to the quantity of radiation striking it. The resistive elements are made from an appropriately doped polycrystalline semiconductor material such as polysilicon. The pixels are provided on a semiconductor device in which the photosensitive resistive elements are provided on a first layer and the pixel associated transistors are provided on a second layer. The fill factor may be approach 100 percent for such pixels.

27 Claims, 5 Drawing Sheets

SOLID STATE OPTICAL IMAGING PIXEL WITH RESISTIVE LOAD

BACKGROUND OF THE INVENTION

The present invention relates to pixel designs for solid state imagers. More specifically, the present invention relates to pixel designs having one or more access transistors and a photosensitive resistive load located above the access transistors.

CMOS image sensors are now becoming competitive with charge coupled device ("CCD") image sensors. Potential applications include digital cameras, night time driving displays for automobiles, and computer peripherals for document capture and visual communications.

Since the 1970s, CCD arrays have dominated the electronic image sensor market. They have outperformed CMOS array sensors in most important criteria including quantum efficiency, optical fill factor (the fraction of a pixel used for detection), charge transfer efficiency, readout rate, readout noise, and dynamic range. However, the steady improvement in CMOS technology (including increasingly small device size) has moved CMOS image sensors into a competitive posture. Further, in comparison to CCD technology, CMOS technology provides lower power consumption, increased functionality, and potentially lower cost. Researchers now envision single chip CMOS cameras having (a) integrated timing and control electronics, (b) a sensor array, (c) signal processing electronics, (d) an analog-to-digital converter, and (e) interface electronics. See Fossum, "CMOS Image Sensors: Electronic Camera On A Chip," IEDM Technical Digest, pp. 17–25, December 1995, which is incorporated herein by reference for all purposes.

CCD arrays are limited in that all image data is read by shifting analog charge packets from the CCD array interior to the periphery in a pixel-by-pixel manner. The pixels of the CCD array are not randomly addressable. In addition, due to voltage, capacitance, and process constraints, CCD arrays are not well suited to integration at the level possible in CMOS integrated circuits. Hence, any supplemental processing circuitry required for CCD sensors (e.g., memory for storing information related to the sensor) must generally be provided on separate chips. This, of course, increases the system's cost.

A conventional CMOS pixel, as illustrated in FIG. 1 (in top view) and described in the above-mentioned Fossum reference, includes one or two pass transistors 5 and 7 (shown as polysilicon gate strips) and a junction diode 11 (shown as a diffusion region in a semiconductor substrate). Regardless of how the signal is read (charge or voltage sensing, active or passive photodiode), the principle of a pixel's operation is based on the reverse biased junction capacitance modulation by light. Photons absorbed in the depletion region of the pre-charged (reverse biased) junction generate electron-hole pairs which discharge the capacitor. Larger junctions collect more photons and are more sensitive, but reduce the resolution of a sensor (as fewer pixels can be placed on available surface area). The lower limit of junction size is the diffraction limit of light.

As shown, access transistor(s) 5 and 7 and junction diode 11 are disposed side-by-side, essentially in the same plane, on the silicon substrate surface. Since the capacitance of the junction in a given technology can be easily set to a required value only by changing its dimensions, the pixel size is largely predetermined by the size of the junction. While the pixel size may be reduced slightly by making the access transistor(s) smaller, and thereby increasing the optical fill factor (the ratio of the pixel active area to the total pixel area), the transistors still limit the fill factor.

In the drive to further miniaturize electronic components including detectors/sensors, the current CMOS photodetector pixel design presents a significant limitation. What is needed therefore is an improved image sensor design that increases the optical fill factor of pixels in CMOS image arrays.

SUMMARY OF THE INVENTION

The present invention provides an image sensor including pixels which occupy a reduced area on the sensor surface. Such pixels include one or more access transistors and a photosensitive resistive element. This element may be formed at a level on the chip above the access transistor(s), thereby providing a stacked arrangement in which the pixel surface area is more fully occupied by a photosensitive element. In some pixel designs, the fill factor may approach about 100 percent.

One specific aspect of the invention is a photosensitive pixel formed on a semiconductor substrate. The pixel may be characterized as including the following features: (a) at least one access transistor located at a first level; and (b) a radiation-sensitive resistive element located at a second level and coupled to the access transistor. The radiation-sensitive resistive element will generally have an exposed surface accessible to radiation, such the radiation-sensitive resistive element undergoes a change in resistance when the pixel is exposed to radiation of a defined intensity.

The radiation-sensitive resistive element may include a body region having a first resistivity and is straddled by two head regions having a second resistivity which is lower than the first resistivity. In a preferred embodiment, the radiation-sensitive resistive element is doped polysilicon having a dopant concentration of up to about $1 \times 10^{18}$ atoms/cm$^3$. For many applications, the radiation-sensitive resistive element has resistance in the dark of at least about one gigaOhm.

The photosensitive pixel may be implemented as a passive pixel or an active pixel, depending on whether it includes an amplifier. A passive implementation of the pixel includes a capacitor having plates connected through the radiation-sensitive resistive element, whereby the amount of radiation striking the radiation-sensitive resistive element controls the rate at which the capacitor discharges. An active implementation of the pixel includes an operational amplifier having a gain control loop including the radiation-sensitive resistive element, whereby the gain of the operational amplifier is a function of the radiation striking the radiation-sensitive resistive element.

A preferred application of the photoresistive pixels of this invention is in the context of an imager such as a CMOS imager used in digital cameras or video equipment. Devices for such applications may include an array of such pixels which provide output signals indicative of physical stimuli to which the detectors have been exposed. Collectively these output signals define an image. Preferably, the imager includes an analog-to-digital converter which receives analog output signals from the array of pixels. An integrated circuit may include both the array of detectors and the analog-to-digital converter on a single semiconductor substrate. Preferably, the pixels of the array are separately addressable.

Yet another aspect of the invention provides a system for producing an image of an object. This system includes an imager including pixels having the structure described above and one or more components for outputting an image resulting from outputs of the pixels. The image may be a photograph in the case of a digital camera for example. The output device may be a computer display device for example.

These and other features and advantages of the invention will be described below in the Detailed Description section with reference to the appended drawings.

DETAILED DESCRIPTION OF THE PREFERRED EMBODIMENTS

Figure 1:
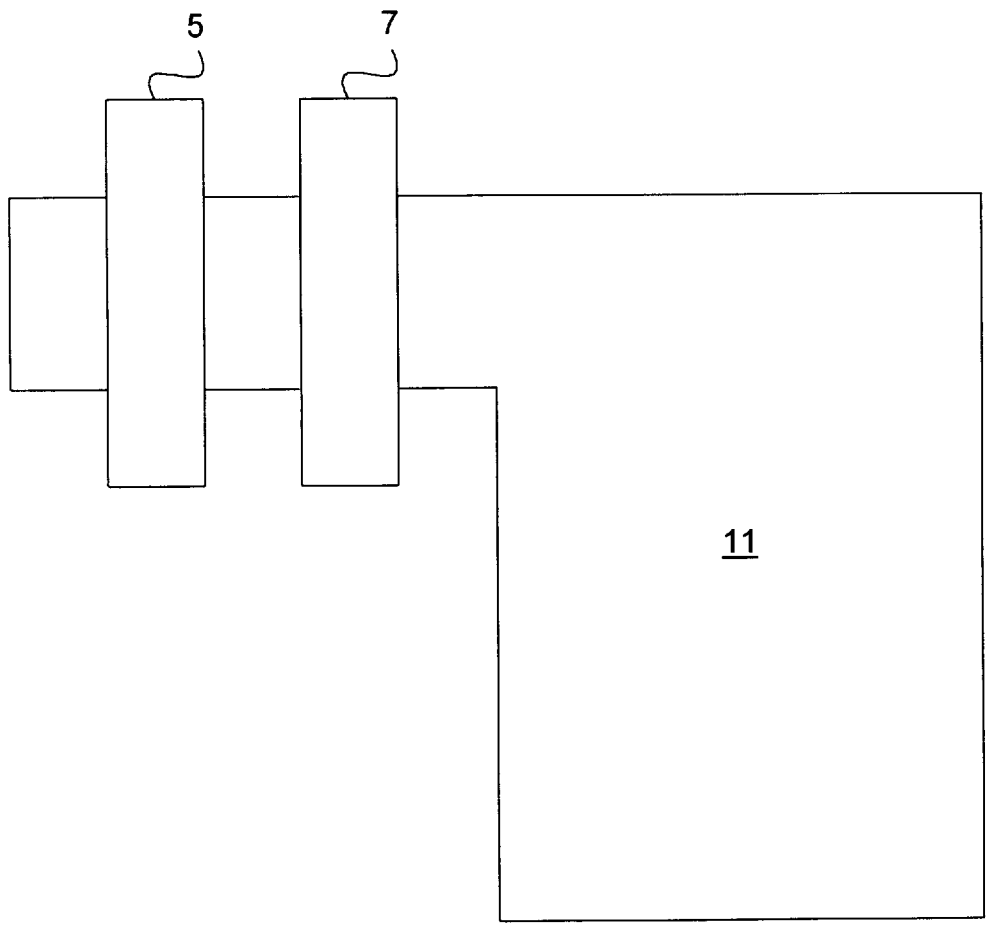
FIG. 1 is a top view of a conventional photodiode pixel viewed from above at the substrate/polysilicon level.

The invention will be described with reference to certain preferred embodiments set forth below. Specifically, the invention will be described with reference to a particular sensor pixel design and a few variants. It should be understood that the invention is in no way specifically limited to these embodiments. For example, while that pixel design is presented as a two transistor "active" pixel design, it can in principle be applied to other designs such as passive pixel designs.

Generally, the pixels of this invention employ a radiation-sensitive resistive element in which the resistance of the element changes in response to the quantity of radiation striking it. The resistive elements may be made from an appropriately doped polycrystalline semiconductor material such as polysilicon. In one important application, the pixels are provided on semiconductor device in which the photosensitive resistive elements are provided on a first layer and the pixel associated transistors are provided on a second layer. Since the active elements (transistors) and passive element (capacitor, photo-sensitive element) can now be disposed in different planes, the pixel layout can be compacted by placing passive elements over active devices. That is, the fill factor of the pixel may be increased; i.e., the percentage of the total pixel area occupied by a photosensitive element may be increased. In some embodiments, the fill factor may be increased to about 100 percent. This allows smaller pixel sizes and/or more sensitive pixels per unit pixel size.

While the invention is not limited to any particular physical mechanism, in most embodiments the radiation-sensitive resistive elements of this invention decrease in resistivity when exposed to radiation of the appropriate wavelength. This may be understood by recognizing that photons of energy equal to or greater than the band gap energy of a resistive element will promote charge carriers to energy bands where they are mobile. Thus, exposure to radiation increases the number of mobile charge carriers in the radiation-sensitive resistive element, thereby increasing conductivity (decreasing resistivity).

Generally, the radiation-sensitive resistive elements of this invention are made from a semiconductor material that is compatible with the process of fabricating the pixel array. A suitable material for the resistive element in a silicon-based structure is doped polysilicon. Other suitable materials for some applications include germanium and gallium arsenide. In a preferred embodiment, the resistive element is polysilicon doped to a concentration of between about $5 \times 10^{17}$ and $5 \times 10^{19}$ atoms/cm$^3$, with a dopant such as boron, phosphorus, or arsenic. An oxygen implant in the photosensitive resistor can be used to enhance the resistivity.

The dopant concentration and type directly affects the polysilicon's resistivity. Thus, the overall resistance of the resistor is determined by its dimensions and dopant concentration. Preferably, the "dark" resistance value is in the GigaOhm range for a photosensitive resistive element sized in such a way as to absorb all of the impinging radiation at the desired wavelength. Preferably, the resistivity change between exposure to high intensity light and darkness is at least about 10:1, and more preferably at least about 20:1 for low illumination levels. This ensures that the pixel will have adequate sensitivity for most applications. Of course, the lower level of acceptable resistivity variation depends upon the type of mechanism employed to sense the resistivity changes in the pixel array. Improvements in sensing elements may allow reduction of the above values.

Figure 2:
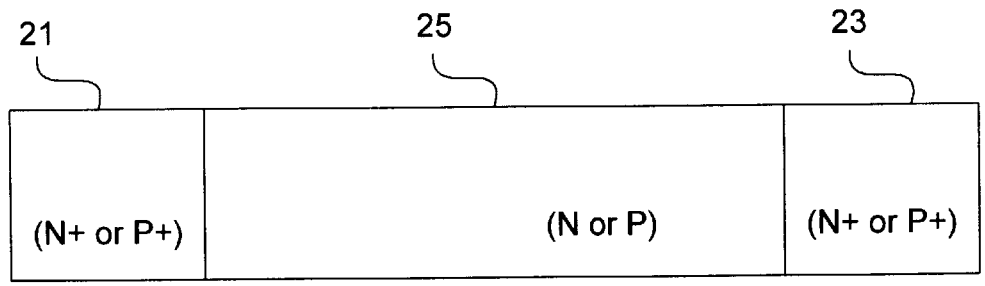
FIG. 2 is a drawing of a generic photosensitive resistive element that may be employed in the pixels of this invention.

In a preferred embodiment of this invention, a polysilicon resistor as illustrated in FIG. 2 has two heavily doped (N+ or P+) regions 21 and 23 (used to interconnect the resistor with the rest of the circuitry) and a lightly doped body 25. If the resistor body is of the same conductivity type as the resistor heads, the load is purely resistive; otherwise the load is composed of two diodes connected back-to-back or face-to-face with the resistor connected in between. One or both of the heavily doped resistor heads can be connected to the levels below (such a source/drain diffusions, gate or interconnect polysilicon) with the aid of a process technology such as "buried contact" technology. The heavily doped resistor head regions provide low resistance contacts to other pixel elements such as pass transistors.

Experiments were conducted by the inventors and have shown doped polysilicon resistive elements to be photosensitive for all possible combinations of the head and body conductivity types, and over a wide range of polysilicon film thickness and doping levels. In one experiment, it has been found that the resistance at 5 volts of a $1 \times 10^{19}$ atoms/cm$^3$ phosphorus doped polysilicon element of length 5 micrometers and cross-sectional area 0.05 micrometers squared was about $3.43 \times 10^{10}$ ohms in the dark, about $2.46 \times 10^9$ ohms in low intensity light, and about $1.02 \times 10^9$ ohms in high intensity light. It has also been found that the relative resistivities of the resistive element on exposure to dark and light is relatively insensitive to voltage changes in the neighborhood of 2 to 5 volts. Thus, it may be desirable in operation to bias the photosensitive element at a voltage in this range.

Figure 3A:
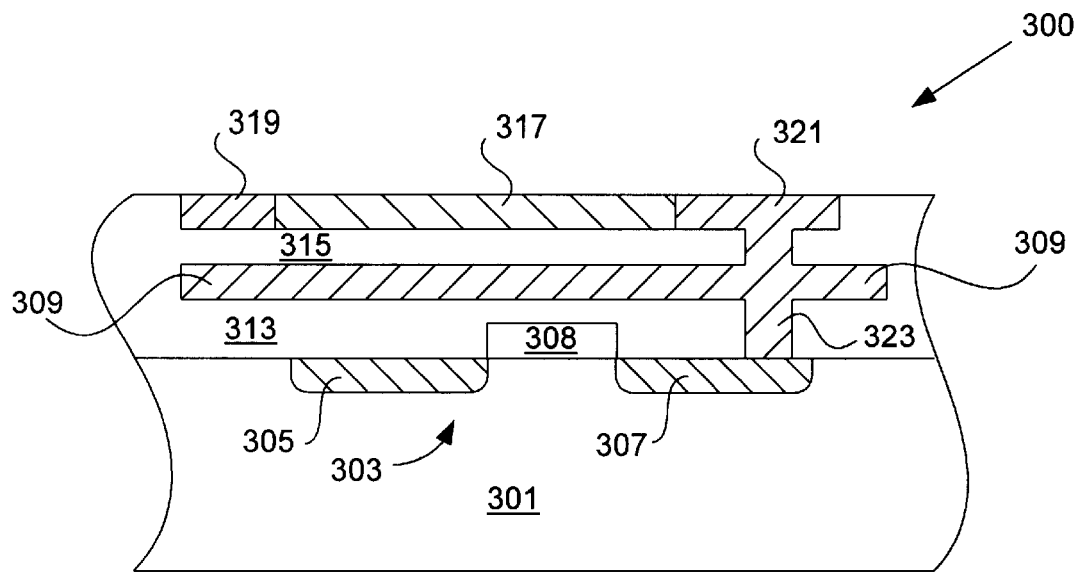
FIG. 3A is a cross-sectional illustration of a pixel employing a capacitor and a photosensitive resistive element in accordance with one embodiment of this invention.
Figure 3B:
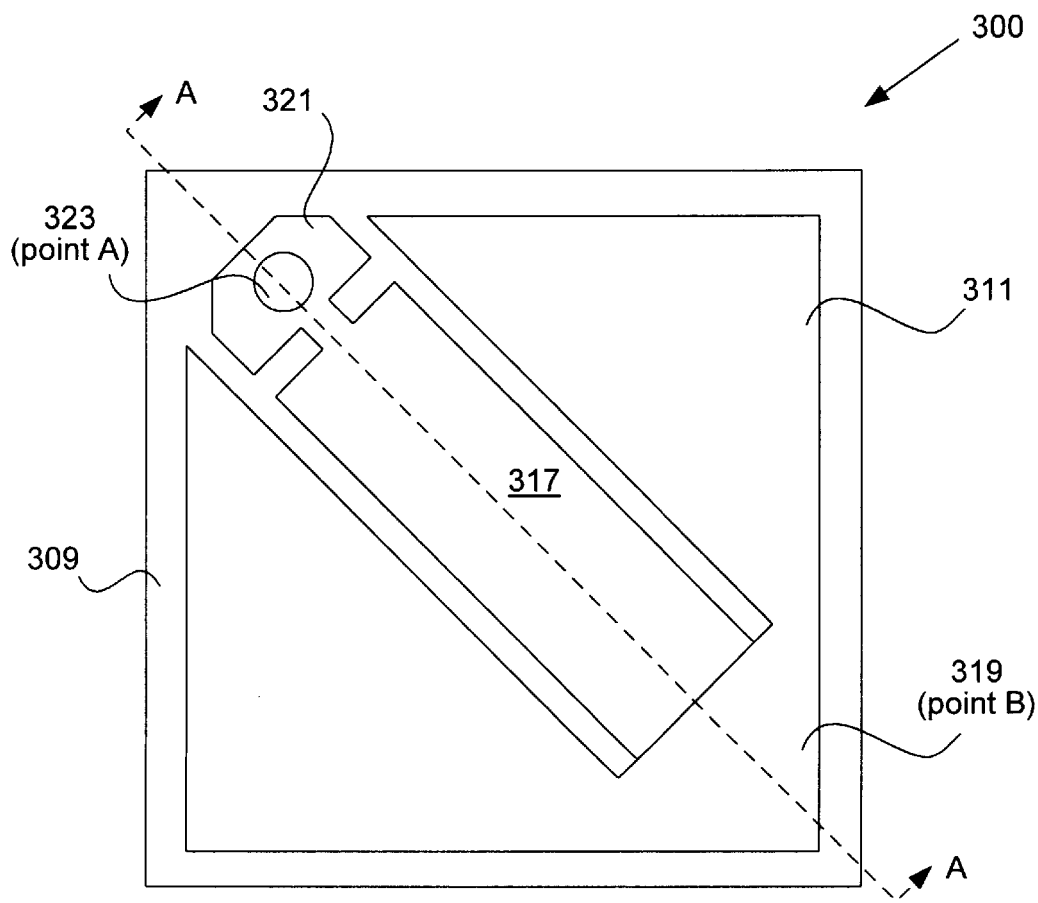
FIG. 3B is a top view of the pixel shown in cross-section in FIG. 3A.

FIGS. 3A and 3B depict a passive pixel structure 300 in accordance with one embodiment of this invention. The pixel structure is shown in cross-section in FIG. 3A and in a top view in FIG. 3B. As shown, the pixel includes a substrate 301, on which is formed an MOS pass transistor 303 including source and drain diffusion regions 305 and 307 formed in the substrate and a gate 308 formed over the substrate. Typically, the gate electrode will be made from polysilicon. Above pass transistor 303 are two polysilicon structures: a first capacitor plate 309 and a second capacitor plate 311. First capacitor plate 309 is separated from substrate 301 and pass transistor 303 by a passivation layer 313. Second capacitor plate 311 is separated from first capacitor plate 309 by a capacitor dielectric layer 315. The second capacitor plate is coupled to a reference voltage node (not shown) preferably through a polysilicon line (also not shown). In one embodiment, the reference voltage is ground.

The same layer that includes second capacitor plate 311 also includes a photosensitive resistive element 317 (body region) which is a region of lower dopant concentration (and possibly higher oxygen concentration). Element 317 is straddled by two relatively high conductivity polysilicon head regions 319 and 321. It is directly connected to the top capacitor plate 311 through head region 319. In essense plate 311 and head region 319 together form a continuous layer of identical or nearly identical composition. An interconnect 323 connects head region 321 to first plate 309 and to drain diffusion 307 of transistor 303. Alternatively, head region 319 is coupled to capacitor plate 309 and to drain diffusion 307 through an interconnect. In either event, one of head regions 319 and 321 is coupled to drain region 307 and the other is connected to a reference voltage source such as ground.

The pixel structure depicted in FIGS. 3A and 3B can be made by straight forward and well-known fabrication processes. Access transistor 303 can be prepared by standard CMOS fabrication steps. Capacitor plates 309 and 311 can be prepared by dielectric deposition, polysilicon deposition on the dielectric layer, followed by patterning to define the shape of the polysilicon capacitor plates. The dielectric and polysilicon deposition steps are preferably, though not necessarily, performed via chemical vapor deposition. Contact 323 may be formed by any standard process such as the "buried contact" process or related process. The buried contact process involves defining an opening in a gate dielectric layer to allow contact to the underlying substrate.

Figure 3C:
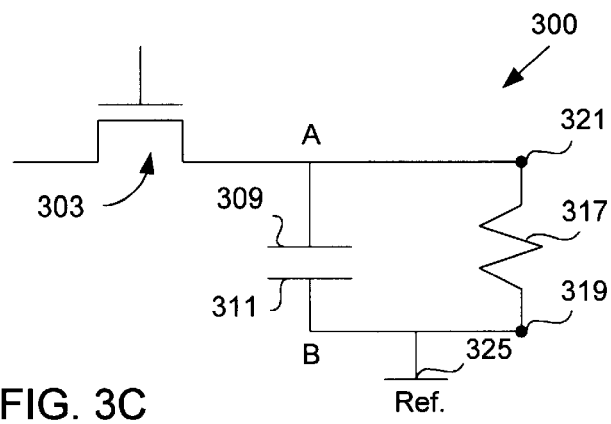
FIG. 3C is a schematic illustration of the pixel of FIGS. 3A and 3B.

FIG. 3C is the equivalent circuit of the pixel structure shown in FIGS. 3A and 3B, where the capacitor defined by plates 309 and 311 is discharged through photosensitive polysilicon load resistor 317. Transistor 303 is coupled to the circuit through one of points A and B; it is shown coupled to point A in FIG. 3C. In the figure, plate 309 is connected to the drain of access transistor 303 and plate 311 is connected to a reference voltage node 325.

In one mode of operation, pixel 300 works as follows. The detection process starts while the pixel is blocked from light or other radiation which it is to record. During this period, the capacitor defined by plates 309 and 311 is charged to a specified voltage by applying a voltage to the drain of transistor 303 (by connecting the drain to a reference voltage source through transistor 303). After the capacitor reaches the desired charge, the pixel is exposed to light and the transistor is turned off. While exposed, the capacitor is discharged through photosensitive resistive element 317. The voltage on plate 311 approaches the reference voltage on plate 309 at an exponential rate having a time constant given by RC, where C is the capacitance on the capacitor and R is primarily the resistance of element 317. The quantity or type of radiation striking element 317 affects its resistance and hence the rate at which the capacitor discharges. At a defined period of time after transistor 303 was switched off, it is switched back on to allow measurement of the remaining charge (or associated voltage) on the capacitor. This quantity correlates with the resistance of element 317 and hence the radiation striking pixel 300 during the period while transistor 303 is switched off. Thus, at a fixed time after capacitor charging and exposure to light, the voltage (or charge) at the pixel can be read to assess the light intensity to which the pixel was exposed. The charge or voltage on pixel 300 can be determined by a charge integrator of the type commonly employed with CMOS sensors. In this case, the pixel output is coupled to a charge integrator (not shown) through pass transistor 303. After the charge is read, the pixel is reset by applying the specified voltage to the drain of transistor 303.

In another mode of operation, the capacitor is charged and the pixel is exposed to light according to the procedure described above. However, when the defined exposure time is reached, the remaining charge is not directly measured. Rather the capacitor is recharged to its initial specified voltage by applying the proper voltage to the drain of transistor 303. The amount of charge required to reset the capacitor is measured. This amount depends upon the resistance of element 317 during exposure. Thus, by measuring the amount of charge required for reset, the system determines how much light struck the pixel during the defined period.

Note that the access transistor(s) is disposed underneath the resistor polysilicon and the capacitance is implemented as an interpolysilicon layer capacitance. An important feature of this and similar implementations is that active components can be disposed under the photosensitive resistor, thus minimizing the pixel area and providing the desired capacitance value. In the specific implementation depicted here, the pixel size is limited by the area of the capacitor plates. However, in other implementations, it may be limited by the size of the photosensitive resistive element.

Various optical layers/elements may be provided on pixel 300—or at least on photosensitive resistive element 317. To simplify the diagram, these additional elements are not shown. These optical elements may include, for example, a lens for optical collection of photons and filters for wavelength discrimination of photons (as used in color pixels). Generally, the photosensitive resistive element of this invention will be "exposed." That is, it will be located "above" any opaque elements that might block it radiation from impinging on it. Thus, the optical elements can be provided on top of it, while, in many embodiments, the pass transistors and other physical circuit elements are provided below it. Of course, if the particular application involves radiation to which a semiconductor substrate (or particular circuit element) is transparent, it is possible that some circuitry could be provided above the photosensitive element.

It should be understood that while pixel 300 is depicted as having an n-type body region (highly resistive) and p-type head regions, the invention is not limited to this arrangement. Thus, the body region could be made p-type and the head regions could be made n-type. Alternatively, the head and body regions could all be of the same conductivity type, n-type or p-type. In any of these cases, the concentration of dopant atoms in the body region should be chosen such that the resistance variation is easily detectable by the sensor's detection circuitry. As noted, radiation impinging on the body region causes generation of additional holes and electrons, thereby increasing the conductivity of the body region.

When the resistor head and the resistor body are of opposite conductivity type, one end of the structure represents a reverse-biased junction. The dominant mechanism (photodiode capacitance or photosensitive resistance) depends on the relative contribution of the photo-generated carriers in the diode depletion region and the resistor body. For long resistors, the affect of conduction in the resistor body will usually dominate.

In addition to a storage capacitor as exemplified in FIGS. 3A through 3C, a photosensitive resistive pixel of this invention may employ various other sensing techniques. In many cases, the sensing techniques employed with pixels of this invention will be different from the sensing techniques employed in conventional junction diode devices. For example, a system may employ a current source to drive a constant current through the photosensitive resistor. Variations in resistance caused by variations in light striking the resistor will cause the voltage across the resistor to vary. Such voltage differences can be monitored to identify the amount (or type) of light striking the pixel.

Figure 4A:
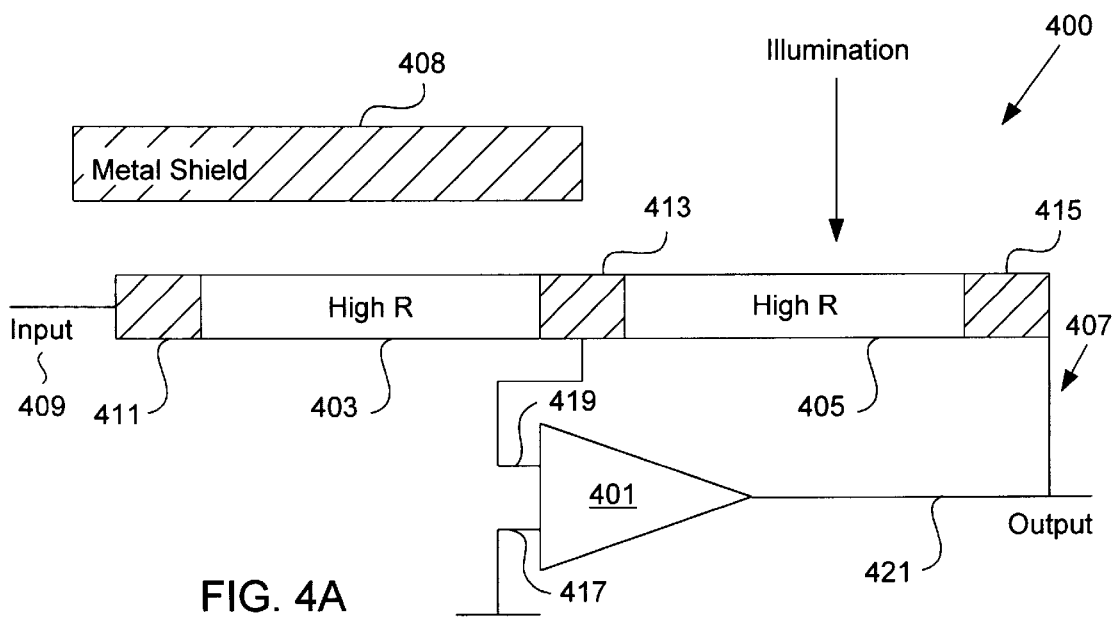
FIG. 4A is a schematic illustration of a pixel employing an amplifier and a photosensitive resistive element in accordance with another embodiment of this invention.
Figure 4B:
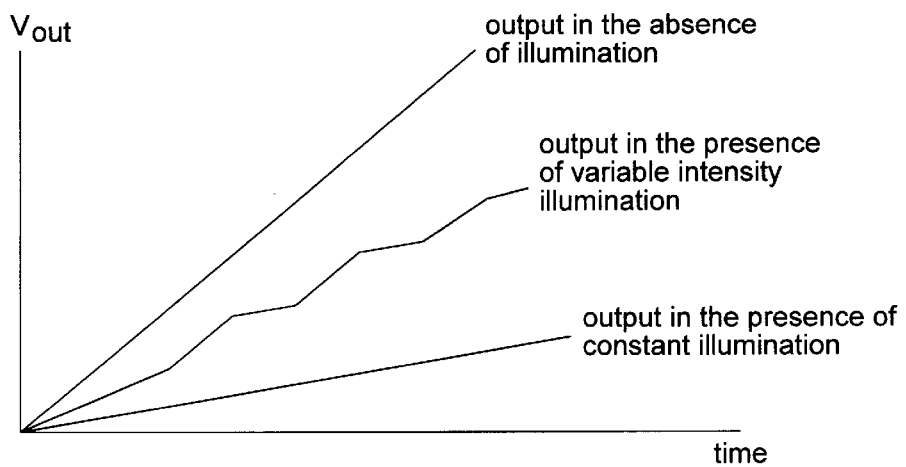
FIG. 4B is a graph showing the output of pixel of FIG. 4A for three different illumination conditions.

An active pixel and detector design is illustrated in FIGS. 4A and 4B. FIG. 4A shows the pixel in a circuit schematic and FIG. 4B shows the pixel's voltage output for different illumination scenarios. In this embodiment, a pixel 400 is provided with integration capability. It includes an operational amplifier 401 and two photosensitive resistive elements 403 and 405, one of which (403) is shielded against the illumination, in a gain control loop 407. An opaque shield 408 (preferably a metal pad in a metallization layer of a semiconductor device structure) covers photosensitive resistive element 403 as shown. In a preferred embodiment, photoresistors 403 and 405 have identical or nearly identical properties. However, because one is shielded from radiation while the other is exposed to radiation, their resistances at any given time may differ. When pixel is kept dark, their resistances should be nearly the same. As described herein, the resistance of shielded photoresistor 403 is represented by $R_i$ and the resistance of exposed photoresistor 405 is represented by $R_f$.

The circuit includes an input 409 which is coupled to shielded photoresistor 403 through a low resistance head region 4t1. Photoresistor 403 is straddled by head regions 411 and 413. It is also coupled to exposed photosensitive resistive element 405 through head region 413. Photoresistor 405 is itself straddled by low resistance head regions 413 and 415.

Operational amplifier 401 has a first input 417 coupled to a reference voltage and a second input 419 coupled to head region 413. An output line 421 of amplifier 401 is coupled to head region 415. As seen, gain control loop 407 includes output 421, head region 415, photoresistor 405, head region 413, amplifier input 419, and amplifier 401. Hence, the gain between the input and output nodes of amplifier 401 is a function of $R_f/R_i$, which is in turn a function of the radiation striking pixel 400; or at least striking photosensitive resistive element 405.

This implementation uses voltage sensing as opposed to charge sensing. In operation, a voltage ramp may be applied to the input of the sense amplifier for the duration of the desired integration time. The output of the amplifier is illustrated in FIG. 4B for three cases: (a) no illumination: the output voltage follows the input voltage; (b) constant illumination: as above, except that the resistor ratio and, hence, the gain of the amplifier is lower; and (c) variable illumination: the effect of the variable illumination is to modulate the gain of the amplifier. The integrated amount of light exposure can be determined at the end of the sense cycle by comparing the outputs of the illuminated and 'dark' pixels.

The photosensitive resistive elements employed in this embodiment, may be constructed similarly to those described above. However, the resistance values of the photosensitive element may be made somewhat lower, which can make the process control easier.

Figure 5:
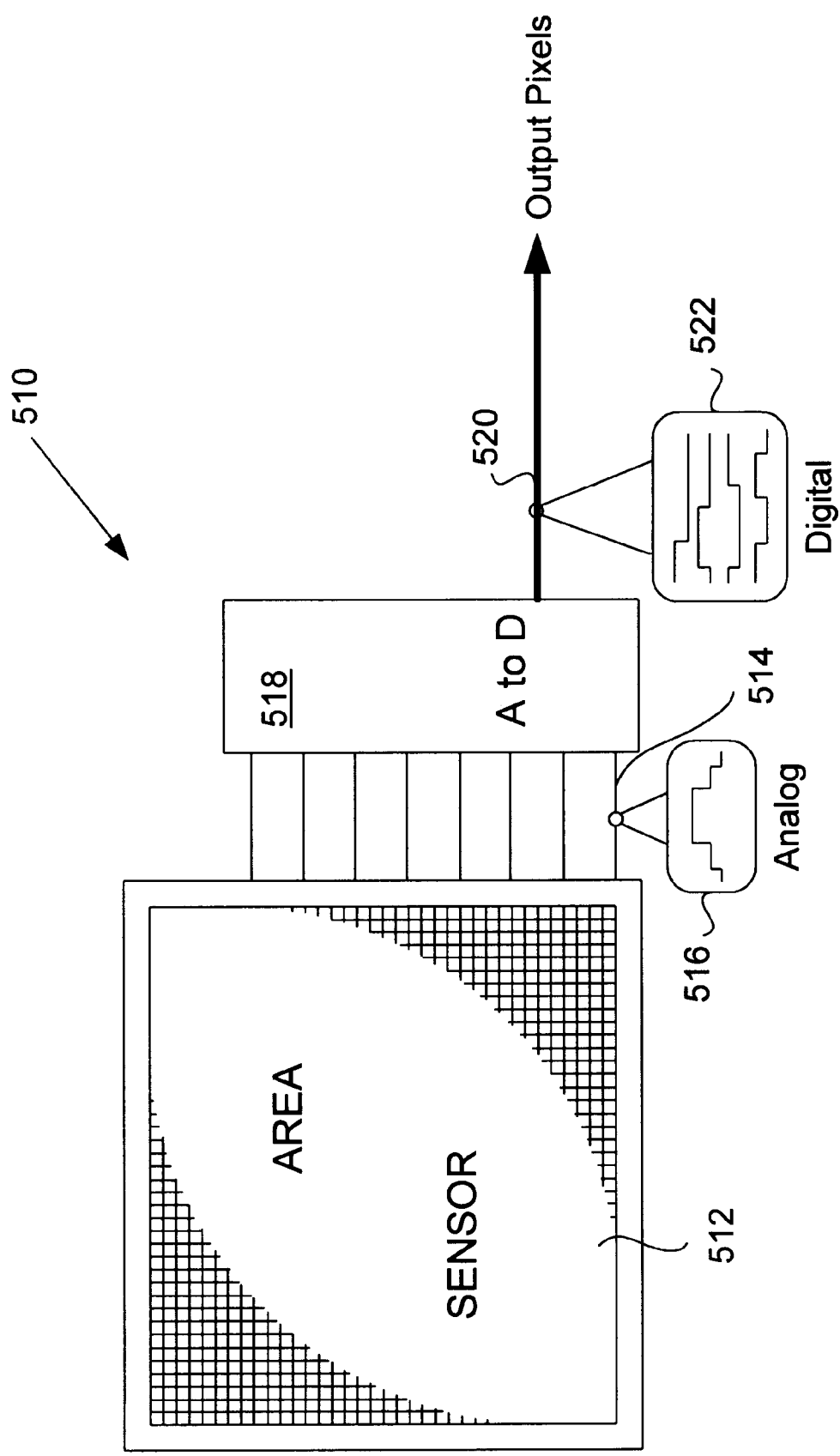
FIG. 5 is a block diagram illustrating high level functional blocks employed in a detector array implementing the pixel design of the present invention.

FIG. 5 presents one preferred system architecture for implementing a CMOS imager in accordance with this invention. Preferably, all elements of the depicted system are implemented on a single integrated circuit chip. The figure presents an imager 510 including two primary elements: a pixel array area sensor 512 and an analog-to-digital converter 518.

Area sensor 512 includes a plurality of regularly arranged pixels each capable of responding to radiation impinging on the sensor. Some or all of these pixels will contain the photosensitive resistive elements of this invention. Often, as in the case of most digital cameras, the radiation will be visible electromagnetic radiation. Detection of other types of radiation is within the purview of this invention. Each pixel produces an output indicative of the radiation intensity over time striking the pixel. In one specific embodiment, area sensor 512 includes an array of 2048 (vertical direction) by 2048(horizontal direction) pixels, but of course the actual array dimensions will depend upon the application and the scale of the IC fabrication technology. In operation, an optical image may be directed onto area sensor 512 such that spatial and/or temporal variations in light intensity (or some other radiation feature such as wavelength) may be temporarily recorded by sensor 512.

The signals from the individual pixels of sensor 512 are output over one or more lines 514 as analog signals 516. These analog signals 516 are received by analog-to-digital converter 518 which converts them to digital signals 522 and outputs such digital signals over a line 520 to image display circuitry.

While the individual elements of system 510 may be implemented on different physical structures, area sensor 512 and analog-to-digital converter 518 are preferably provided on a single integrated circuit chip. One of the most significant benefits of CMOS-based image sensors is their easy integration with on-chip analog-to-digital converters. Preferably, the analog-to-digital converter will consume little power and occupy little area, yet meet the pixel processing rate at the resolution required of the system's application. It is possible to have a single analog-to-digital converter for the entire array (operating at a the pixel rate), a single converter for each pixel (operating at the frame rate), a converter for each column of the array (operating at the line rate), or some other division of labor.

Figure 6:
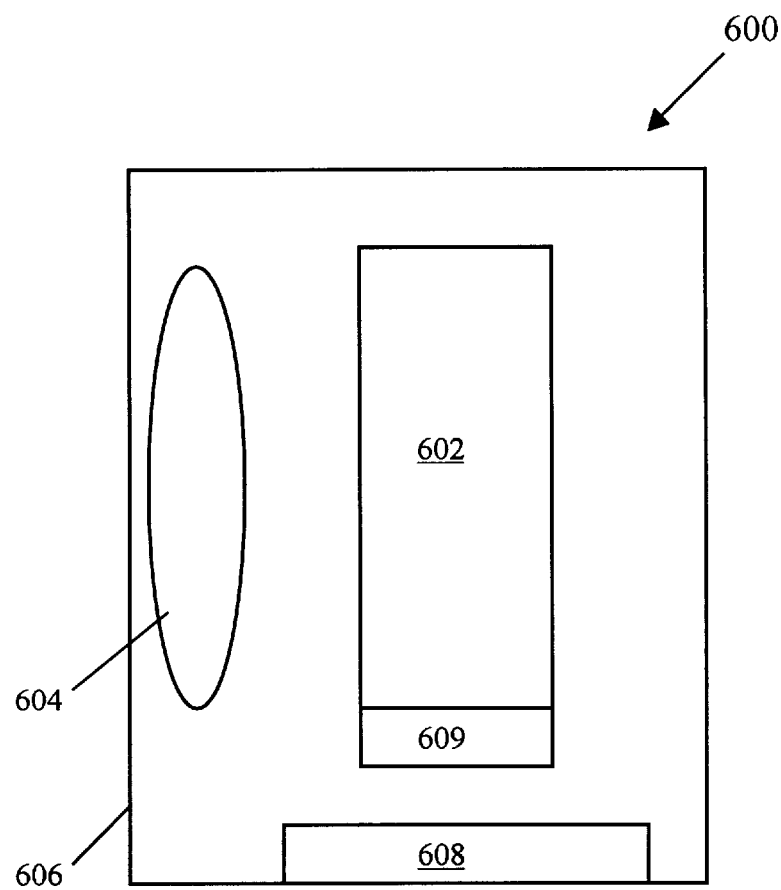
FIG. 6 is a block diagram illustrating a system employing a sensor implementing the pixel design of the present invention.
Figure 6:
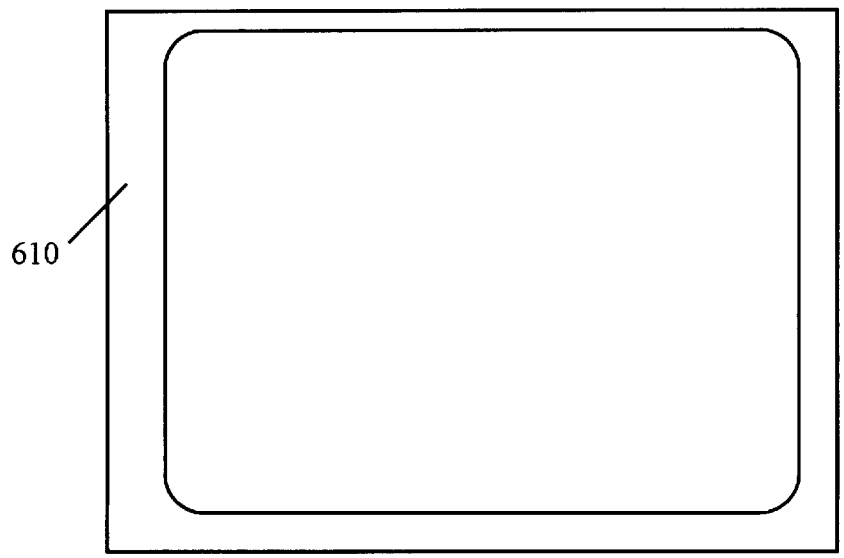

Detector arrays employing the pixels of this invention may be deployed in various systems for military, scientific, business, and home applications. For example, they may be used in digital cameras, video recorders, night driving displays, etc. Generally, as illustrated in FIG. 6, a system 600 will include, in addition to a detector array 602, optics 604 to capture an image and direct it onto the array. This may include one or more lenses, filters, etc. of the types conventionally employed in image capture systems. The optics and detector array will be mounted in a casing 606 such as a camera case. The system will also include an output mechanism 608 for outputting the image(s) from an analog-to-digital converter 609 of this invention to a display system 610 such as a printer or computer system. Such computer system may include a computer display device such as an LCD screen, a plasma display, or a CRT display (together with associated printing and display electronics and/or software). The output mechanism may include appropriate data buses connectors and possibly cabling. Further, the system may include a memory for temporarily storing captured images for later downloading to the display system. In some instances, the display system itself will form part of the overall imager system. The ultimate output may take the form of an image on a display screen, a photograph, a printed page, a display on a window forming part of operating machinery such as an automobile, airplane, etc.

Although the foregoing invention has been described in some detail for purposes of clarity of understanding, it will be apparent that certain changes and modifications may be practiced within the scope of the appended claims. For example, while the specification has described certain pixel and chip architectures which accomplish the objectives of the present invention, many others which will be understood by those of skill in the art from the present disclosure to be within the spirit of the present invention may equally be used. Therefore, the present embodiments are to be considered as illustrative and not restrictive, and the invention is not to be limited to the details given herein, but may be modified within the scope of the appended claims.

What is claimed is:

1. A photosensitive pixel formed on a semiconductor substrate, the pixel comprising:
    (a) at least one access transistor located at a first layer of the semiconductor substrate; and
    (b) a radiation-sensitive resistive element located at a second layer of the semiconductor substrate and coupled to said access transistor, wherein the radiation-sensitive resistive element has an exposed surface accessible to radiation, and wherein the radiation-sensitive resistive element undergoes a change in resistance when exposed to radiation of a defined intensity
    wherein the first layer of the semiconductor substrate having the at least one access transistor is below the second layer of the semiconductor substrate having the radiation-sensitive element.

2. The photosensitive pixel of claim 1, wherein the radiation-sensitive resistive element comprises a body region having a first resistivity and is straddled by two head regions having a second resistivity which is lower than the first resistivity.

3. The photosensitive pixel of claim 1, wherein the radiation-sensitive resistive element comprises doped polysilicon.

4. The photosensitive pixel of claim 3, wherein the doped polysilicon has a dopant concentration of up to about $5 \times 10^{19}$ atoms/cm$^3$.

5. The photosensitive pixel of claim 1, wherein the radiation-sensitive resistive element has resistance in the dark of at least about one Gigaohm.

6. The photosensitive pixel of claim 1, further comprising a capacitor having plates connected through the radiation-sensitive resistive element, whereby the amount of radiation striking the radiation-sensitive resistive element controls the rate at which the capacitor discharges.

7. The photosensitive pixel of claim 6, wherein one plate of the capacitor is formed at the same level as the radiation-sensitive resistive element and another plate of the capacitor is formed at a level below the level of the radiation-sensitive resistive element.

8. The photosensitive pixel of claim 1, wherein the pixel is selected from the group consisting of a passive pixel and an active pixel.

9. The photosensitive pixel of claim 1, wherein the pixel has a fill factor of about 100 percent.

10. The photosensitive pixel of claim 1, further comprising an operational amplifier having a gain control loop wherein the radiation-sensitive resistive element is in the gain control loop and thereby the gain of the operational amplifier is a function of the radiation striking the radiation-sensitive resistive element.

11. An imager comprising an array of detectors for providing output signals indicative of physical stimuli to which the one or more detectors has been exposed, wherein at least one of the detectors comprises:
    (a) at least one access transistor located at a first layer of a semiconductor structure; and
    (b) a radiation-sensitive resistive element located at a second layer of the semiconductor structure and coupled to the access transistor, wherein the radiation-sensitive resistive element has an exposed surface accessible to radiation, and wherein the radiation-sensitive resistive element undergoes a change in resistance when exposed to radiation of a defined intensity
    wherein the first layer having the at least one access transistor is below the second level having the radiation-sensitive element.

12. The imager of claim 11, wherein the radiation-sensitive resistive element comprises doped polysilicon.

13. The imager of claim 11, wherein the detector further comprises a capacitor having plates connected through the radiation-sensitive resistive element, whereby the amount of radiation striking the radiation-sensitive resistive element controls the rate at which the capacitor discharges.

14. The imager of claim 11, wherein the detector further comprises an operational amplifier having a gain control loop wherein the radiation-sensitive resistive element is in the gain control loop and whereby the gain of the operational amplifier is a function of the radiation striking the radiation-sensitive resistive element.

15. The imager of claim 11, wherein the pixel has a fill factor of about 100 percent.

16. The imager of claim 11, wherein the detectors are separately addressable.

17. The imager of claim 11, wherein the imager is a CMOS imager formed on a semiconductor substrate.

18. The imager of claim 11, further comprising an analog-to-digital converter which receives analog output signals from the array of detectors, wherein the array of detectors and the analog-to-digital converter are provided on a single semiconductor substrate.

19. A system for producing an image of an object, the system comprising:
    (a) an array of detectors for providing output signals indicative of physical stimuli to which the one or more detectors has been exposed, wherein at least one of the detectors comprises:
        (i) an access transistor located at a first layer of a semiconductor structure, and
        (ii) a radiation-sensitive resistive element located at a second layer of the semiconductor structure and coupled to the access transistor, wherein the radiation-sensitive resistive element has an exposed surface accessible to radiation, and wherein the radiation-sensitive resistive element undergoes a change in resistance when exposed to radiation of a defined intensity; and
    (b) an output device for outputting an image resulting from the outputs of the array of detectors wherein the first layer having the access transistor is below the second level having the radiation-sensitive element.

20. The system of claim 19, wherein the radiation-sensitive resistive element comprises doped polysilicon.

21. The system of claim 19, wherein the detector further comprises a capacitor having plates connected through the radiation-sensitive resistive element, whereby the amount of radiation striking the radiation-sensitive resistive element controls the rate at which the capacitor discharges.

22. The system of claim 19, wherein the detector further comprises an operational amplifier having a gain control loop wherein the radiation-sensitive resistive element is in the gain control loop and whereby the gain of the operational amplifier is a function of the radiation striking the radiation-sensitive resistive element.

23. The system of claim 19, wherein the pixel has a fill factor of about 100 percent.

24. The system of claim 19, wherein the detectors are separately addressable.

25. The system of claim 19, wherein the output device is a CMOS imager formed on a semiconductor substrate.

26. The system of claim 19, wherein the image output by the means for outputting is a photograph.

27. The system of claim 19, wherein the output device is a computer display device.

* * * * *